United States Patent
Chen et al.

(10) Patent No.: US 6,319,826 B1
(45) Date of Patent: *Nov. 20, 2001

(54) METHOD OF FABRICATING BARRIER LAYER

(75) Inventors: Ming-Shing Chen, Feng-Shan; Yung-Chieh Kuo, Taipei, both of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/267,875

(22) Filed: Mar. 11, 1999

(30) Foreign Application Priority Data

Jan. 22, 1999 (TW) .................................. 88100964

(51) Int. Cl.[7] ...................... H01L 21/44; H01L 21/4763
(52) U.S. Cl. ...................... 438/653; 438/656; 438/643; 438/648
(58) Field of Search ...................... 438/653, 643, 438/648, 627, 652, 654, 655, 656

(56) References Cited

U.S. PATENT DOCUMENTS

| | | | |
|---|---|---|---|
| 5,604,140 | * | 2/1997 | Byun . |
| 5,705,442 | * | 1/1998 | Yen et al. . |
| 5,712,193 | * | 1/1998 | Hower et al. . |
| 5,766,830 | * | 7/1998 | Sumi et al. . |
| 5,851,912 | * | 12/1998 | Liaw et al. . |
| 6,045,666 | * | 4/2000 | Satitpunwaycha et al. . |
| 6,140,223 | * | 10/2000 | Kim et al. . |
| 6,177,338 | * | 1/2001 | Liaw et al. . |
| 6,217,721 | * | 4/2001 | Xu et al. . |

OTHER PUBLICATIONS

Stanley Wolf and Richard N. Tauber, "Silicon Processing for the VLSI Era, vol. 1: Process Technology," Lattice Press, Sunset Beach, California (1986), p. 648.*

* cited by examiner

Primary Examiner—Charles Bowers
Assistant Examiner—Stephen W. Smoot
(74) Attorney, Agent, or Firm—Jiawei Huang; J.C. Patents

(57) ABSTRACT

A method of forming a barrier layer is described. A dielectric layer is formed on a substrate. The dielectric layer comprises an opening exposing a portion of the substrate. A metallic layer, which is conformal to the opening, is formed on the dielectric layer. A first metallic nitride layer, which is conformal to the opening, is formed on the first metallic layer by chemical vapor deposition. The second metallic nitride layer, which is conformal to the opening, is formed on the first metallic nitride layer.

20 Claims, 4 Drawing Sheets

METHOD OF FABRICATING BARRIER LAYER

CROSS-REFERENCE TO RELATED APPLICATION

This application claims the priority benefit of Taiwan application Ser. No. 88100964, filed Jan. 22, 1999.

BACKGROUND OF THE INVENTION

1. Field of the Invention

The present invention relates to a semiconductor fabricating method. More particularly, the present invention relates to a method of fabricating a barrier layer.

2. Description of the Related Art

As the integration of integrated circuits increase, the surface area of a wafer becomes insufficient for fabrication of required interconnections. In order to meet the surface requirement of the interconnections, multi-layered interconnections have become widely used in highly integrated devices. Typically, a dielectric layer is formed between metallic layers to isolate the metallic layers from each other. A metallic plug is formed to connect the metallic layers to each other. However, in order to improve the adhesion between the metallic plug and other materials as well as to avoid a spike effect between the metallic plug and silicon material, it is necessary to form a barrier layer before the metallic plug.

Conventionally, physical vapor deposition (PVD) is used to form a barrier layer for a contact or a via with a small aspect ratio (A. R.). However, in a fabrication process with a linewidth of 0.25 micrometers, or below, the aspect ratio correspondingly increases. Therefore, the barrier layer formed by physical vapor deposition on a contact, or a via, having a high aspect ratio does not have a sufficient step coverage ability. Thus, chemical vapor deposition, which provides a good step coverage ability, has become widely used for forming the barrier layer.

Titanium nitride (TixNy) is a barrier layer material frequently used in Very Large Scale Integration (VLSI). In order to improve the ohmic contact between the metallic plug and the silicon material, titanium nitride is usually used with titanium. For example, titanium/titanium nitride (Ti/TiN) are used together as a barrier layer in order to reduce the work function at a junction as well as to prevent the occurrence of the spike effect and electrical migration. Apart from using the titanium nitride as a barrier layer, in a tungsten plug fabrication process, the titanium nitride also can be used as an etching stop during a tungsten etching back step.

In FIG. 1A, a metal oxide semiconductor (MOS) transistor 102 is formed on a substrate 100. A patterned dielectric layer 104 is formed on the substrate 100 to cover the MOS transistor 102. The patterned dielectric layer 104 comprises a contact opening 106. The contact opening 106 exposes a portion of a source/drain region 108 in the substrate 100.

In FIG. 1B, a titanium layer 110 is sputter-deposited on the dielectric layer 104 to cover the exposed source/drain region 108. The titanium layer 110 is conformal to the contact opening 106. The thickness of the titanium layer 104 is about 40 angstroms. In order to increase the deposition ability of the titanium layer 110, a collimator (not shown) is placed between the substrate 100 and a metallic target (not shown) while forming the titanium layer 110. A titanium nitride layer 112 is formed on the titanium layer 110 by chemical vapor deposition (CVD). The titanium nitride layer 112 is conformal to the contact opening 106. The titanium layer 110 and the titanium nitride layer together form a barrier layer. The thickness of the titanium nitride layer 112 is about 300 angstroms.

In FIG. 1C, a rapid thermal process (RTP) 114 is performed on the titanium layer 110 and the titanium nitride layer 112 in an environment of a $NH_3$ gas. A titanium silicon ($Ti_xSi_y$) layer 115 is formed between the titanium layer 110 and the source/drain region 108, so as to decrease the resistance between a tungsten plug formed subsequently (shown in FIG. 1E) and the source/drain region 108.

In FIG. 1D, a tungsten layer 116, which has a good thermal endurance and a good conductivity, is formed on the titanium nitride layer 112 to fill the contact opening 106 by chemical vapor deposition.

In FIG. 1E, a tungsten etching back step is performed with $SF_6$ gas and argon gas serving as a source gas. The titanium nitride 112 serves as an etching stop layer during the etching back step. The tungsten layer 116 is etched back to form a tungsten plug 116a.

However, the titanium nitride layer 112 formed by chemical vapor deposition is incompact. Additionally, organic impurities easily remain within the titanium nitride layer 112. The remaining organic impurities in the titanium nitride layer 112 easily react with the titanium layer 110 during the rapid thermal process. In this manner, the titanium layer 110 is over consumed, so that the resistance between the tungsten plug 116a and the source/drain region 108 can not effectively be reduced as expected. Furthermore, titanium nitride 112 easily reacts with the nitrogen gas, and thus further increases the resistance between the tungsten plug 116a and the source/drain region 108.

To solve the above-described problem, the conventional method is to change the process order, so that the rapid thermal process 114 is performed before the formation of the titanium nitride layer 112. Thus, the titanium layer 110 and the titanium nitride layer 112 cannot be formed in an in-situ manner. Hence, the fabrication cost and the fabrication time are greatly increased.

In addition, because the titanium nitride layer 112 is incompact, the dielectric layer 104, such as an oxide layer, and the titanium layer 110 are easily over-etched during the tungsten etching back step. In order to avoid the over-etching problem, it is necessary to form a thick titanium nitride layer 112. However, the thick titanium nitride layer 112 causes the resistance to increase and degrades the device performance, as well. Thus, it is desirable to use chemical-mechanical polishing (CMP) instead of a tungsten etching back step. However, because the cost of the chemical mechanical polishing is high, it is not suitable for an economic fabrication process.

SUMMARY OF THE INVENTION

The invention provides a method of forming a barrier layer. A dielectric layer is formed on a substrate. The dielectric layer comprises an opening exposing a portion of the substrate. A metallic layer is formed over the substrate by ionized metallization-plasma(IMP) deposition. A first metallic nitride layer is formed on the first metallic layer by chemical vapor deposition. The second metallic nitride layer is formed on the first metallic nitride layer by high-power plasma deposition. The metallic layer, the first metallic nitride layer, and the second metallic nitride layer are conformal to the opening and together form a barrier layer.

The barrier layer formed in the present invention can be utilized in a metallic plug, a via in interconnections, a contact for dynamic random memory (DRAM), electrostatic discharge (ESD) devices, input/output (I/O) port, etc.

In comparison with the conventional method, the invention forms a thicker first metallic layer by IMP deposition. When a rapid thermal process is performed, the first metallic layer is sufficient to form a silicide layer. The compact second metallic nitride layer is formed on the first metallic nitride layer. In the rapid thermal process, the second metallic nitride layer prevents the first metallic nitride layer from reacting with $NH_3$ gas. High-power plasma deposition is used to form the compact second metallic nitride layer that covers the metallic nitride layer, which is formed by CVD. Since the second metallic nitride layer is compact, the second metallic nitride layer prevents the dielectric layer from being over-etched.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
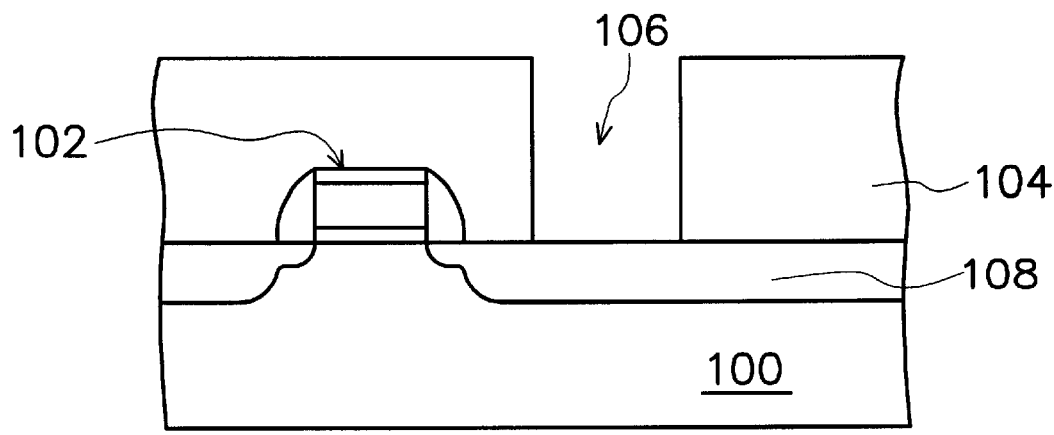
FIGS. 1A through 1E are schematic, cross-sectional views of a conventional method of fabricating a metallic plug.
Figure 1B:
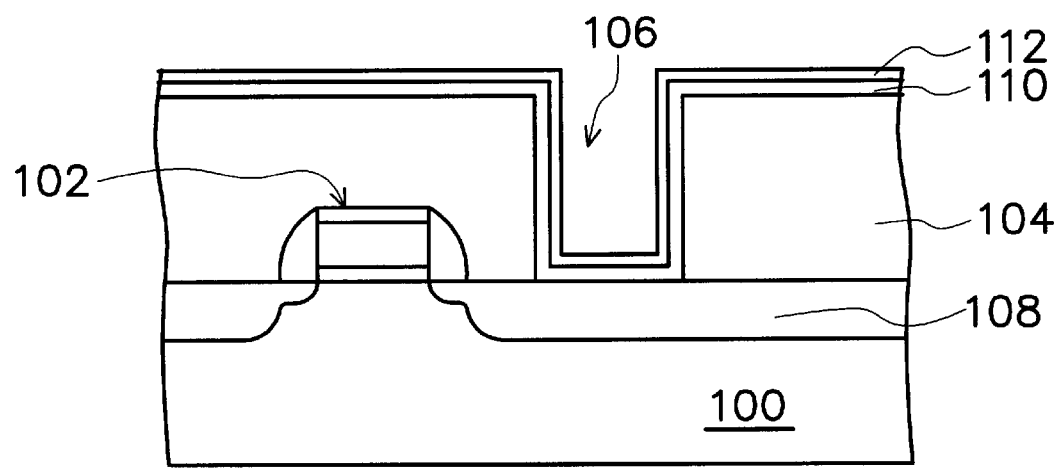
Figure 1C:
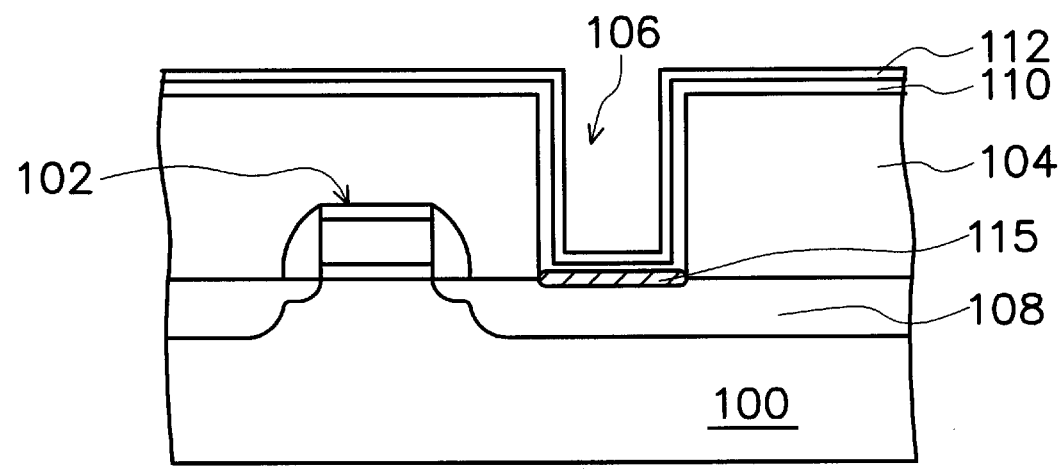
Figure 1D:
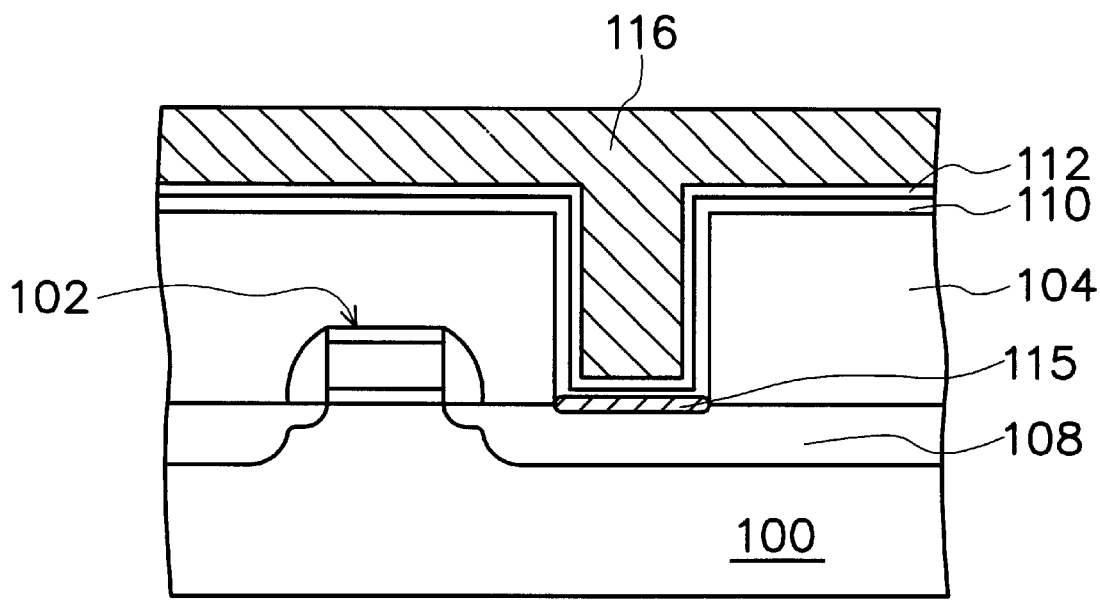

Reference will now be made in detail to the present preferred embodiments of the invention, examples of which are illustrated in the accompanying drawings. Wherever possible, the same reference numbers are used in the drawings and the description to refer to the same or like parts.

In this preferred embodiment a barrier layer used for a metallic plug is taken as an example.

Figure 2A:
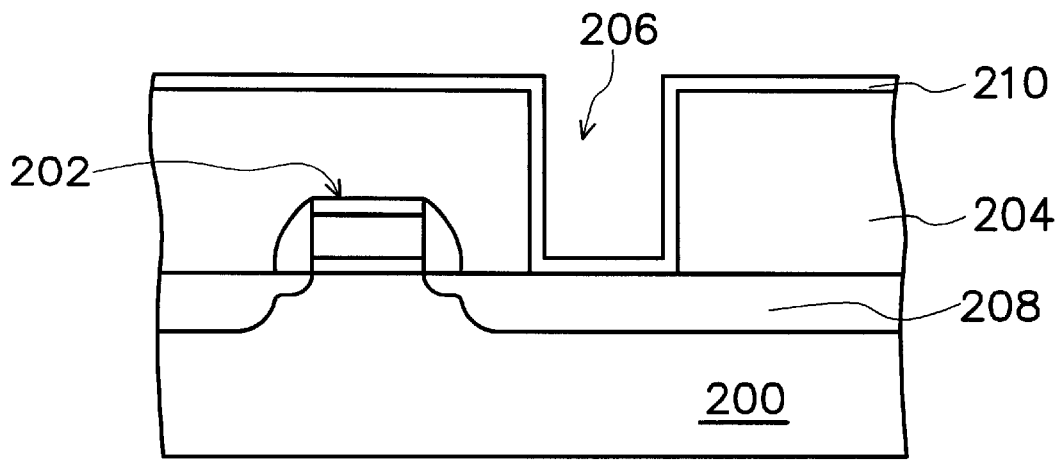
FIGS. 2A through 2E are schematic, cross-sectional views showing a method of fabricating a metallic plug according to one preferred embodiment of the invention.

In FIG. 2A, a MOS transistor 202 is formed on a substrate 200. A patterned dielectric layer 204 is formed on the substrate 200 to cover the MOS transistor 202. The patterned dielectric layer 204 comprises an opening 206. The opening 206 exposes a portion of a source/drain region 208 in the substrate 200. A metallic layer 210, which is conformal to the opening 206, is formed over the substrate 200 and in a surface of the opening 206. The metallic layer 210 is preferably formed by ionized metallization-plasma (IMP) deposition. The metallic layer 210 on a top surface of the dielectric layer 204 preferably has a thickness of about 300 angstroms to 400 angstroms. In addition, the metallic layer 210 on a bottom of the opening 206 preferably has a thickness of about 70 angstroms to 130 angstroms. Because the step coverage ability of the metallic layer 210 formed by IMP deposition is good, in contrast with the conventional method, the requirement to place a collimator between a metallic target (not shown) and the substrate 200 in order to form the metallic layer 210 can be omitted here. Additionally, the metallic layer 210 formed by IMP deposition is thicker than the metallic layer formed in the conventional method with a collimator.

Figure 2B:
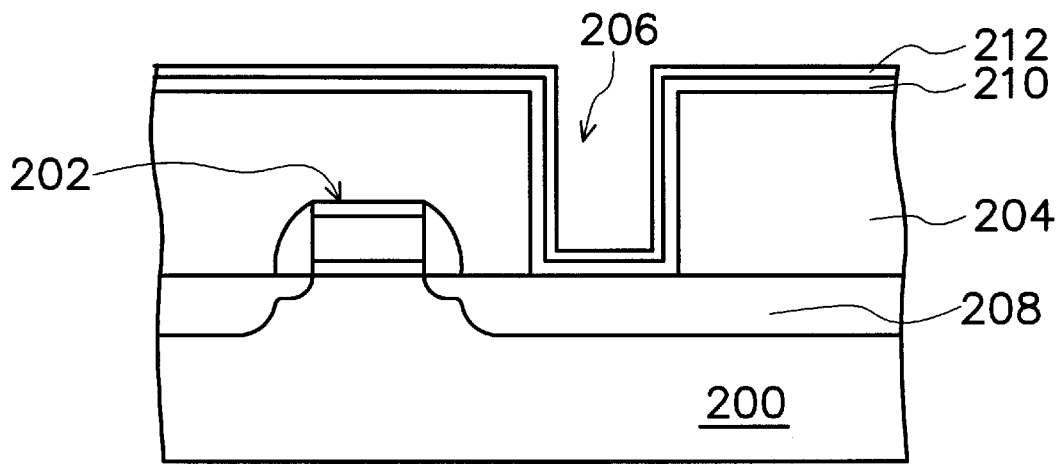

In FIG. 2B, a first metallic nitride layer 212, which is conformal to the opening 206, is formed on the metallic layer 210 by chemical vapor deposition (CVD). The material of the first metallic nitride layer 212 comprises titanium nitride (TiN) or tantalum nitride (TaN), and preferably it is titanium nitride. The thickness of the first metallic nitride layer 212 on the bottom of the opening 206 preferably is about 100 angstroms to 200 angstroms.

Figure 2C:
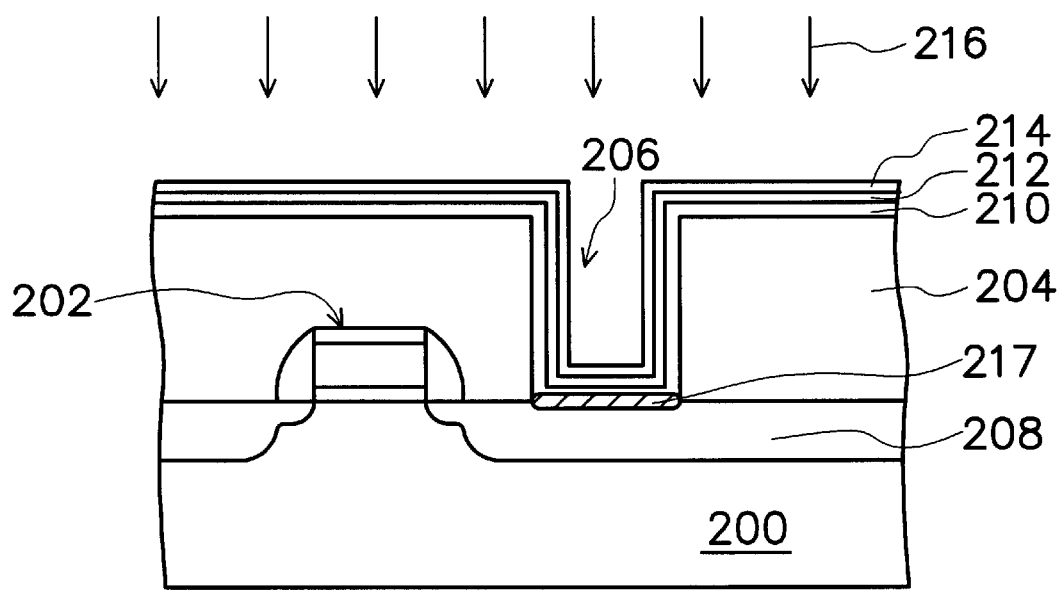

In FIG. 2C, a second metallic nitride layer 214 is formed on the first metallic nitride layer 212. The second metallic nitride layer 214 preferably is formed by high-power plasma deposition. The second metallic nitride layer 214 is conformal to the opening 206. The material of the second metallic nitride layer 214 comprises titanium nitride or tantalum nitride, and preferably is titanium nitride. The high power plasma deposition is performed with a mixture of argon gas and $NH_3$ gas to bombard a titanium nitride target (not shown), so as to generate a high-power titanium nitride plasma. The titanium nitride plasma is deposited on the first metallic nitride layer 212 to form the second metallic nitride layer 214. The second metallic nitride layer 214 formed by high-power plasma deposition is substantially very compact wherein the thickness of the second metallic nitride layer 214 at the bottom of the opening is about 30 angstroms to 50 angstroms. A barrier layer, which comprises the metallic layer 210, the first metallic nitride layer 212, and the second metallic nitride layer 214, is thus formed. A rapid thermal process 216 is performed on the metallic layer 210, the first metallic nitride layer 212, and the second metallic nitride layer 214 under a $NH_3$ gas environment. A silicide layer 217 is formed between the metallic layer 210 and the source/drain region 208, so as to decrease the resistance between a metallic plug (shown in FIG. 2F) and the source/drain region 208. In case that the material of the metallic layer 210 is titanium, the silicide layer 217 is a titanium silicide layer.

Figure 2D:
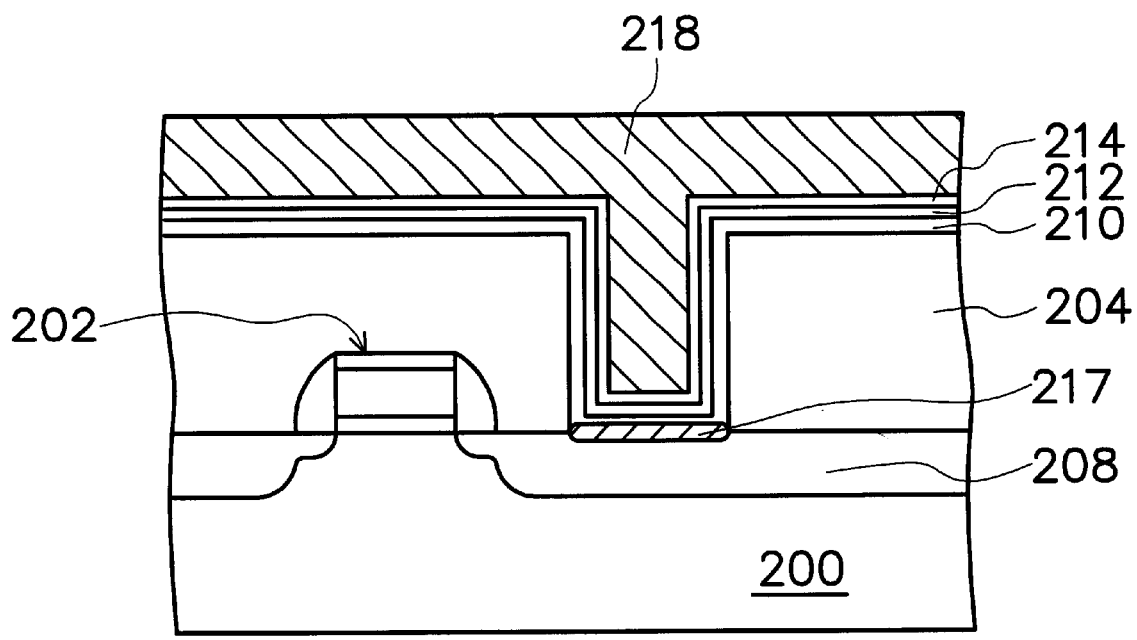

In FIG. 2D, a metallic layer 218, which has a good thermal endurance and a good conductivity, is formed on the titanium nitride layer 214 to fill the opening 206. The material of the metallic layer 218 comprises tungsten. The metallic layer 218 can be formed by, for example, chemical vapor deposition.

Figure 2E:
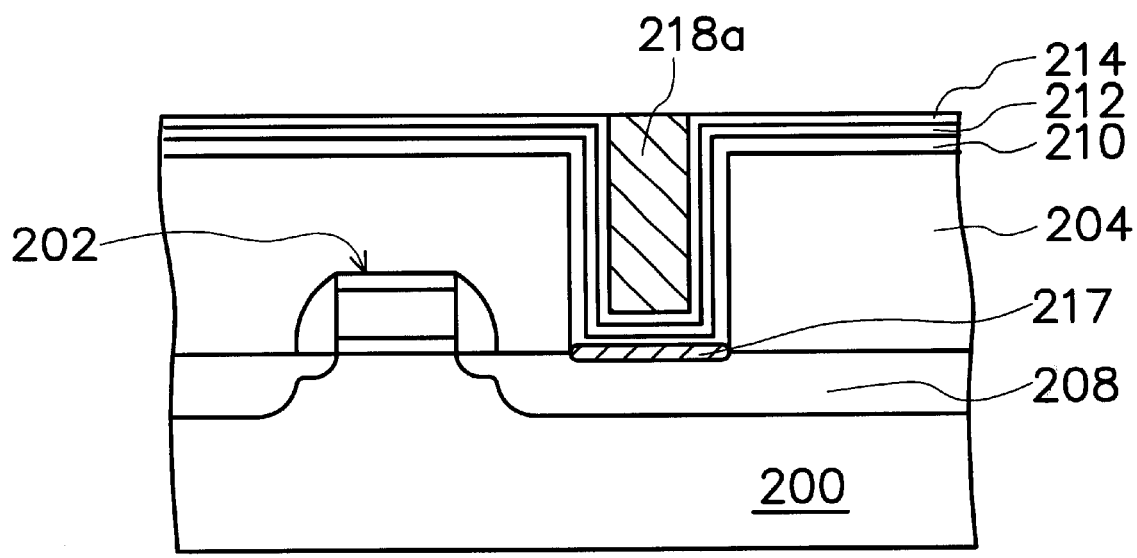

In FIG. 2E, an etching back step is performed with the titanium nitride layer 214 serving as an etching stop. The metallic layer 218 is etched back until the titanium nitride layer 214 is exposed. A metallic layer 218a remains from the metallic layer 218. Preferably, the etching back step is performed with a $SF_6$ gas and an argon gas as a gas source.

The preferred embodiment takes the barrier layer utilized in the metallic plug fabrication process as an example. It is appreciated that the technique disclosed in this invention also can be utilized in other devices, such as a via in interconnections, a contact for DRAM, electrostatic discharge (ESD) devices, input/output (I/O) port, etc.

Figure 1E:
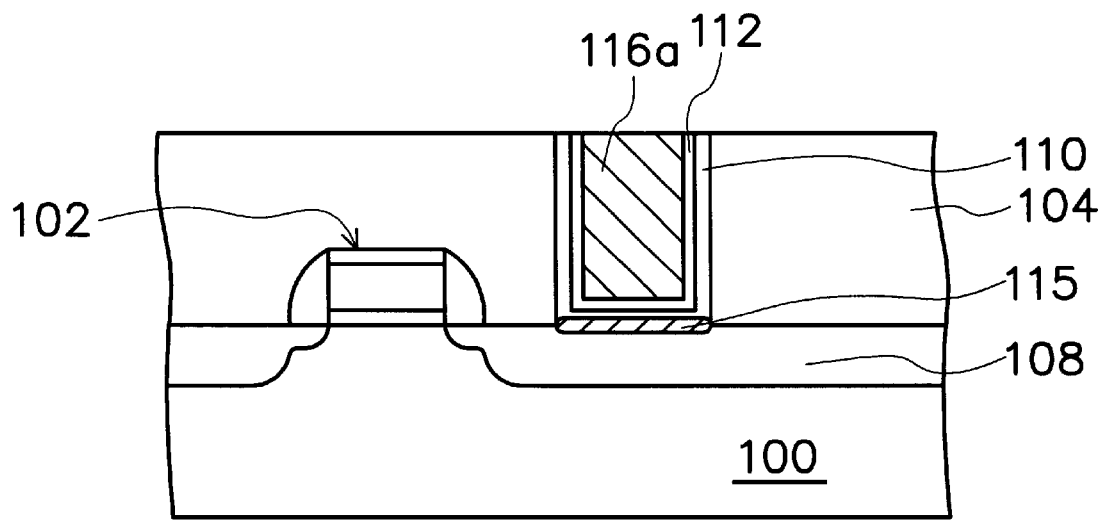

In summary, the invention includes at least the following advantages:

1. In comparison with the conventional method, the invention forms a thicker metallic layer 210 by IMP deposition. When the rapid thermal process is performed, the thick metallic layer 210 is sufficient to form the silicide layer 217. Thus, the insufficient silicide layer 115 (shown in FIG. 1E) arising from the effect of remaining organic impurities on the titanium nitride layer 112 does not form.

2. The compact metallic nitride layer 214 is formed on the metallic nitride layer 212. In the rapid thermal process, the metallic nitride layer 214 prevents the metallic nitride layer 212 from reacting with the $NH_3$ gas, so as to prevents the increased resistance.

3. High-power deposition is used to form the compact metallic nitride layer 214 that covers the metallic nitride layer 212, which is formed by CVD. Since the metallic nitride layer 214 is compact, the metallic nitride 214 layer prevents the dielectric layer 204 from being over-etched.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a barrier layer, comprising:
   forming a dielectric layer on a substrate, wherein the dielectric layer comprises an opening exposing a portion of the substrate;
   forming a conformal metallic layer on the dielectric layer and a surface of the opening, wherein a thickness of the metallic layer on a bottom of the opening is sufficient to prevent an over-consumption of the metallic layer in a subsequent rapid thermal process (RTP) and a thickness of a portion of the metallic on the dielectric layer is different from a thickness of a portion of the metallic layer on the bottom of the opening;
   forming a conformal first metallic nitride layer on the metallic layer; and
   forming a compact conformal second metallic nitride layer on the first metallic nitride layer by deposition, wherein the conformal second metallic nitride layer is sufficiently compact to prevent the conformal first metallic nitride layer from reacting with a nitrogen gas.

2. The method of claim 1, wherein the thickness of the conformal metallic layer on the bottom of the opening is about 70 angstrom to about 130 angstroms.

3. The method of claim 1, wherein the first metallic layer with thickness on a bottom of the opening that is sufficient to prevent an over-consumption of the first metallic layer is formed by ionized metallization-plasma deposition.

4. The method of claim 1, wherein the conformal second metallic nitride layer that is sufficiently compact to prevent the conformal first metallic nitride layer from reacting with a nitrogen gas has a thickness of about 30 angstroms to about 50 angstroms.

5. The method of claim 1, wherein the first metallic nitride layer is formed by chemical vapor deposition.

6. A method of forming a barrier layer, comprising steps of:
   forming a dielectric layer on a substrate, wherein the dielectric layer comprises an opening exposing a portion of the substrate;
   forming a conformal metallic layer over the substrate, covering the dielectric layer and a surface of the opening, wherein a thickness of the metallic layer at a bottom of the opening is about 70 angstroms to about 130 angstroms and a thickness of the metallic layer on the top surface of the dielectric layer is about 300 angstroms to about 400 angstroms;
   forming a first metallic nitride layer on the metallic layer by chemical vapor deposition, wherein the first metallic nitride layer is conformal to the opening; and
   forming a second metallic nitride layer on the first metallic nitride layer, wherein the second metallic nitride layer is conformal to the opening and is compact to prevent an increase of a contact resistance.

7. The method of claim 6, wherein the step of forming the metallic layer comprises ionized metallization-plasma deposition.

8. The method of claim 6, wherein a material of the metallic layer comprises titanium.

9. The method of claim 6, wherein a material of the first metallic nitride layer and the second metallic nitride comprises titanium nitride.

10. The method of claim 6, wherein a thickness of the first metallic nitride layer on the bottom of the opening is§a out 100 angstroms to 200 angstroms.

11. The method of claim 6, wherein a thickness of the second metallic nitride layer on the bottom of the opening is about 30 angstroms to 50 angstroms.

12. The method of claim 6, further comprising a step of rapid thermal process after the step of forming the second metallic nitride layer.

13. A method of fabricating a metallic plug, comprising steps of:
   forming a dielectric layer on a substrate, wherein the dielectric layer comprises an opening exposing a portion of the substrate;
   forming a thick first metallic layer on the dielectric layer and on a surface of the opening by performing a step of ionized metallization plasma deposition, wherein the thick first metallic layer is sufficient to prevent an over-consumption of the first metallic layer in a subsequent rapid thermal process (RTP) and a thickness of the metallic layer at a bottom of the opening is about 70 angstroms to about 130 angstroms and a thickness of the metallic layer on the top surface of the dielectric layer is about 300 angstroms to about 400 angstroms;
   forming a first metallic nitride layer on the first metallic layer by chemical vapor deposition, wherein the first metallic nitride layer is conformal to the opening;
   forming a compact second metallic nitride layer on the first metallic nitride layer by a deposition process under conditions different from those used in the chemically vapor deposited first metallic nitride layer, wherein the second metallic nitride layer is sufficiently compact to prevent the first metallic nitride layer from reacting with a nitrogen gas when the second metallic nitride layer is exposed to the nitrogen gas;
   forming a second metallic layer on the second metallic nitride layer to fill the opening; and
   removing a portion of the second metallic layer to form a metallic plug.

14. The method of claim 13, wherein a material of the first metallic layer comprises titanium.

15. The method of claim 13, wherein a material of the first metallic nitride and the second metallic layer comprises titanium nitride.

16. The method of claim 13, further comprises a step of rapid thermal process after the step of forming the second metallic nitride layer and after the step of forming the second metallic layer.

17. The method of claim 13, wherein a material of the second metallic layer comprises tungsten.

18. The method of claim 13, wherein the step of removing a portion of the second metallic layer comprises etching back with the second metallic nitride layer serving as an etching stop.

19. The method of claim 13, wherein a thickness of the first metallic nitride layer on the bottom of the openings is about 100 angstroms to 200 angstroms.

20. The method of claim 13, wherein a thickness of the second metallic nitride layer on the bottom of the opening is about 30 angstroms to 50 angstroms.

* * * * *